(12) United States Patent
Okumura et al.

(10) Patent No.: US 10,091,882 B2
(45) Date of Patent: Oct. 2, 2018

(54) CIRCUIT STRUCTURE USING PRINTED-CIRCUIT BOARD

(71) Applicant: Sumitomo Wiring Systems, Ltd., Yokkaichi, Mie (JP)

(72) Inventors: Masakazu Okumura, Mie (JP); Akihiro Oda, Mie (JP); Tatsuya Daidoji, Mie (JP); Ryoma Hamada, Mie (JP); Noriko Okamoto, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/811,753

(22) Filed: Nov. 14, 2017

(65) Prior Publication Data
US 2018/0160537 A1    Jun. 7, 2018

(30) Foreign Application Priority Data
Dec. 5, 2016 (JP) ................................ 2016-236152

(51) Int. Cl.
*H05K 1/18* (2006.01)
*H05K 1/02* (2006.01)

(52) U.S. Cl.
CPC ............. *H05K 1/18* (2013.01); *H05K 1/0213* (2013.01); *H05K 2201/10189* (2013.01)

(58) Field of Classification Search
CPC ................... H05K 1/18; H05K 1/0213; H05K 2201/10189
See application file for complete search history.

(56) References Cited

U.S. PATENT DOCUMENTS

| 6,290,509 | B1 * | 9/2001 | Hattori | H01R 9/24 439/76.2 |
|---|---|---|---|---|
| 2001/0040049 | A1 * | 11/2001 | Sumida | H01R 9/2458 174/261 |
| 2002/0080562 | A1 * | 6/2002 | Nakamura | H01H 9/10 361/626 |
| 2010/0203746 | A1 * | 8/2010 | Kita | H01H 85/2035 439/76.1 |
| 2014/0198470 | A1 * | 7/2014 | Shi | H05K 1/144 361/803 |

FOREIGN PATENT DOCUMENTS

JP    H09-135058 A    5/1997

* cited by examiner

*Primary Examiner* — Steven T Sawyer
(74) *Attorney, Agent, or Firm* — Honigman Miller Schwartz and Cohn LLP

(57) ABSTRACT

Provided is a circuit structure using a printed-circuit board with a novel structure that can provide a plurality of types of circuit specifications by switching connection of circuit patterns, allows circuit specifications to be easily identified, and achieves excellent connection workability and connection stability for circuit patterns. The circuit structure includes: a printed-circuit board 18 on which a plurality of circuit patterns are provided; and a circuit switching component, wherein the circuit switching component includes bus bar support bases on which any connection bus bars selected can be mounted and held, the plurality of types of connection bus bars are classified according to the number and the position of lead portions to be electrically connected to connection points, and a plurality of types of circuit specifications are provided by changing a mounting mode of the connection bus bars to the bus bar support bases.

5 Claims, 6 Drawing Sheets

CIRCUIT STRUCTURE USING PRINTED-CIRCUIT BOARD

CROSS-REFERENCE TO RELATED APPLICATIONS

This application claims priority to Japanese Patent Application No. JP 2016-236152 filed Dec. 5, 2016.

TECHNICAL FIELD

The present invention relates to a circuit structure using a printed-circuit board.

BACKGROUND

Hitherto, circuit structures using a printed-circuit board have been used in electrical junction boxes and other vehicle-mounted devices, and a plurality of circuit patterns are formed on the printed-circuit board. With the recent increase in the number of types of printed-circuit boards to support different circuits according to the vehicle classification and the like, there has been concern over an increase in the manufacturing costs involved in the manufacturing and the storage/maintenance of such printed-circuit boards having different specifications.

To make improvements in this respect, it is conceivable to make analogous use of, for example, a circuit structure using a printed-circuit board proposed in JP H09-135058A. Such a circuit structure enables a single printed-circuit board to be jointly used even in cases where power supply voltage specifications differ. By using such a printed-circuit board, it is possible, with only a single printed-circuit board, to support power supply voltages of different specifications by changing the circuit pattern connected with jumper wires and lead wires according to the specification. Therefore, the number of types of printed-circuit boards used can be reduced, thus making it possible to reduce the manufacturing costs involved in the manufacturing thereof and the storage/maintenance of printed-circuit boards.

However, in the case of changing the circuit pattern connected with jumper wires and lead wires, the connection points are determined in accordance with the routing pattern of the circuit, and connection points are provided at various locations on a printed-circuit board to allow for different specifications.

Moreover, the provision of connection points at various locations on the printed-circuit board may pose such problems that the workability during soldering of the jumper wires and the lead wires to the circuit pattern may be impaired owing to the positional relationship with other mounted members, and that the length of the jumper wires may be increased to avoid interference with other members, resulting in poor connection stability.

SUMMARY OF THE INVENTION

The present invention has been made in light of the above-described circumstances, and a problem to be solved by the invention is to provide a circuit structure using a printed-circuit board with a novel structure that can provide a plurality of types of circuit specifications by switching connection of circuit patterns, and achieves excellent connection workability and connection stability for circuit patterns.

A circuit structure using a printed-circuit board according to a first aspect of the present invention includes: a printed-circuit board on which a plurality of circuit patterns are provided; and a circuit switching component placed on the printed-circuit board, wherein the circuit switching component includes a plurality of types of connection bus bars, and a bus bar support base on which any connection bus bar selected from the plurality of types of connection bus bars can be mounted and held, respective connection points of the plurality of circuit patterns are disposed below the bus bar support base and arranged so as to be spaced apart from each other in an extension direction of the bus bar support base, the plurality of types of connection bus bars are classified according to the number and the position of lead portions to be electrically connected to the connection points, and a plurality of types of circuit specifications are provided by changing a mounting mode of the connection bus bars to the bus bar support base.

According to this aspect, it is possible to provide a plurality of types of circuit specifications by locally disposing the connection points of the plurality of circuit patterns below the bus bar support base serving as the circuit switching component mounted on the printed-circuit board, and changing the mounting mode of the connection bus bars to the bus bar support base. This makes it possible to identify the circuit specification at a glance by simply verifying the mounting mode of the bus bar serving as the circuit switching component, thus increasing the efficiency of verification work, and reducing the risk of the circuit specification being misidentified at an early stage.

Moreover, as a result of the connection points of the plurality of circuit patterns being localized below the circuit switching component, the length of the connection bus bars used for circuit switching can be minimized, so that it is possible to reduce the material costs and the like, and perform circuit switching with a compact structure, thus advantageously solving the problem of interference between the members for circuit switching and other members.

In addition, since the connection bus bars are mounted and held on the bus bar support base, it is possible to advantageously ensure the connection stability between the circuits.

Note that the mounting modes of the connection bus bars to the bus bar support base also include a mode in which one or more connection bus bars selected from the plurality of types of connection bus bars are mounted, and a mode in which none of the connection bus bars are mounted. In addition, the number of circuit patterns to be connected by the connection bus bars is not limited to two, and any number of two or more circuits can be connected. That is, any number of lead portions may be provided in the connection bus bars.

A circuit structure using a printed-circuit board according to the second aspect of the present invention is directed to the circuit structure using a printed-circuit board according to the first aspect, wherein the plurality of circuit patterns include three or more circuit patterns, the connection points of the circuit patterns are provided below the bus bar support base, and three or more lead portion insertion holes are formed so as to extend through the bus bar support base at positions corresponding to the connection points of the three or more circuit patterns.

According to this aspect, the lead portion insertion holes are provided in the bus bar support base at corresponding positions above the connection points of the three or more circuit patterns, so that it is possible to perform switching of a larger number of types of circuit specifications in a simple and reliable manner, while ensuring the positionability of the lead portions.

A circuit structure using a printed-circuit board according to a third aspect of the present invention is directed to the circuit structure using a printed-circuit board according to the first or second aspect, wherein the bus bar support base is formed integrally with an electric component mounted on the printed-circuit board.

According to this aspect, the bus bar support base is formed integrally with the component mounted on the printed-circuit board, and thus it is possible to further save space and reduce the number of components, making it possible to make the circuit switching component even more compact.

A circuit structure using a printed-circuit board according to a fourth aspect of the present invention is directed to the circuit structure using a printed-circuit board according to the third aspect, wherein the electric component is a power supply connector module.

According to this aspect, the bus bar support base is formed integrally with the power supply connector module mounted on the printed-circuit board. Since a plurality of circuit patterns are routed around the power supply connector module, it is possible to more effectively achieve the localized placement of the connection points of the circuit patterns below the bus bar support base, thus achieving further compactness.

According to the present invention, a plurality of types of circuit specifications can be provided by locally disposing the connection points of the plurality of circuit patterns below the bus bar support base of the circuit switching component mounted on the printed-circuit board, and changing the mounting mode of the connection bus bars to the bus bar support base. This makes it possible to improve the efficiency of the verification work, and reduce the risk of the circuit specification being misidentified as quickly as possible. Moreover, by localizing the connection points below the circuit switching component, the length of the connection bus bars can be minimized, so that the material costs and the like can be reduced. Also, the circuit switching can be performed with a compact structure, so that it is possible to advantageously solve the problem of interference between the members for circuit switching and other members. In addition, since the connection bus bars are mounted and held on the bus bar support base, it is possible to advantageously ensure connection stability between the circuits.

DETAILED DESCRIPTION OF PREFERRED EMBODIMENTS

Hereinafter, an embodiment of the present invention will be described with reference to the drawings.

Figure 1:
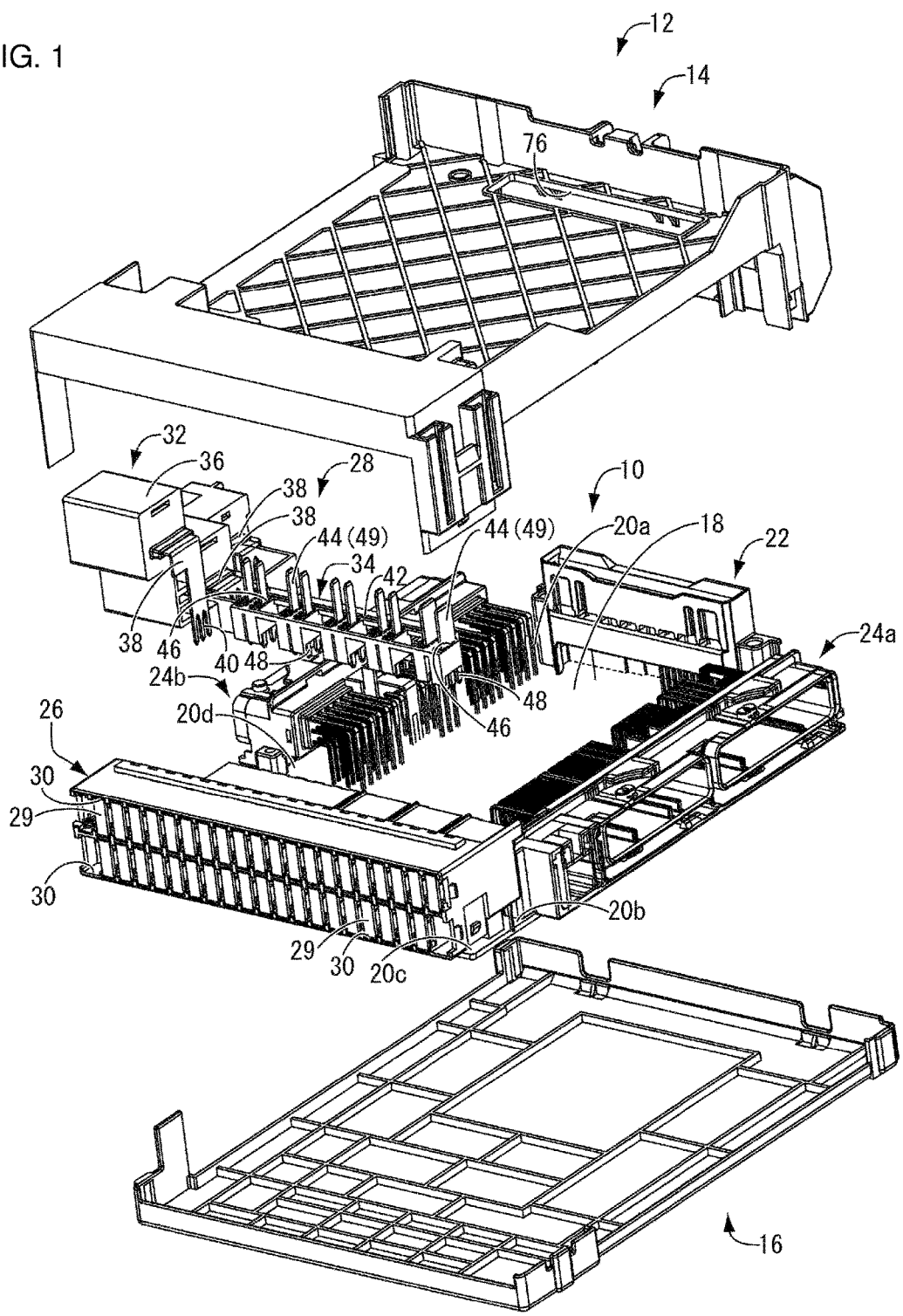
FIG. 1 is an exploded perspective view of an electrical junction box in which a circuit structure using a printed-circuit board according to an embodiment of the present invention is housed.
Figure 2:
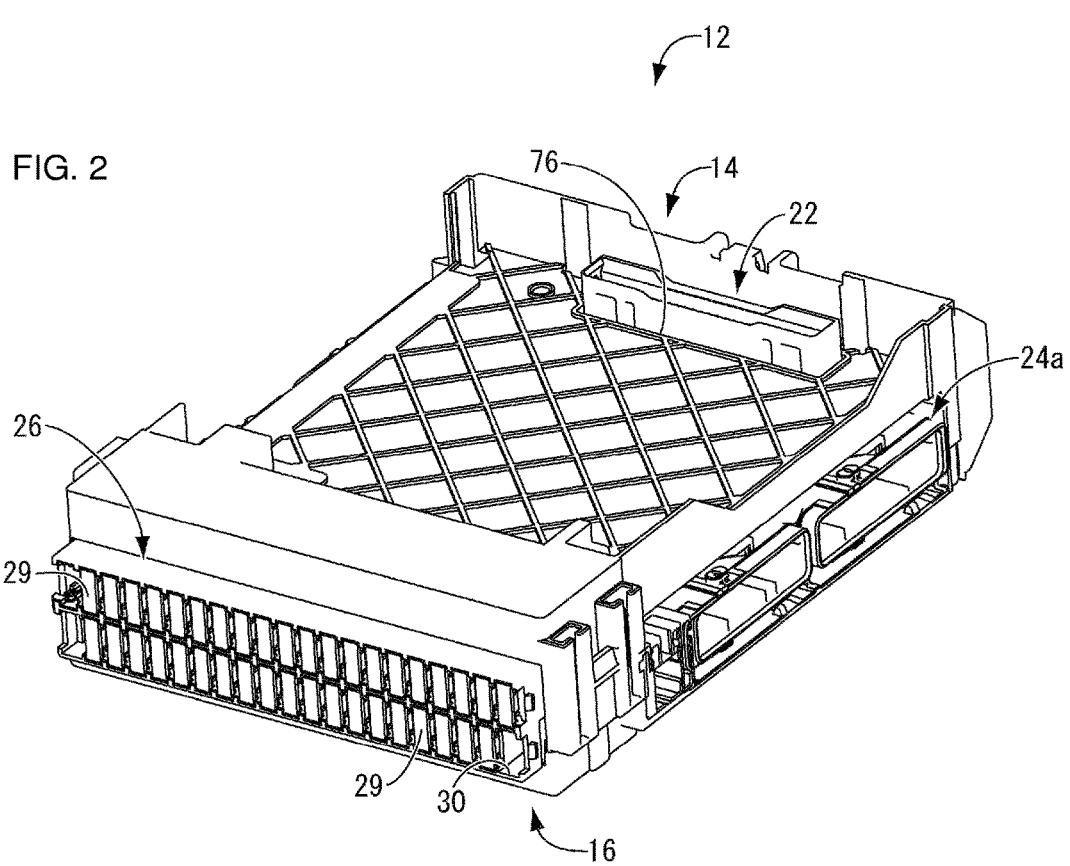
FIG. 2 is an overall perspective view of the electrical junction box shown in FIG. 1 in an assembled state.

FIGS. 1 and 2 show an electrical junction box 12 in which a circuit structure 10 using a printed-circuit board according to an embodiment of the present invention is housed. As shown in FIG. 1, the electrical junction box 12 is structured such that the circuit structure 10 is housed between an upper case 14 and a lower case 16 each formed through injection molding or the like using a synthetic resin such as polypropylene (PP) or polyamide (PA). In the following description, "upward" refers to the upper case 14 side, "downward" refers to the lower case 16 side, "forward" refers to the downward direction in FIG. 3, and "rearward" refers to the upward direction in FIG. 3, unless otherwise specified.

Figure 3:
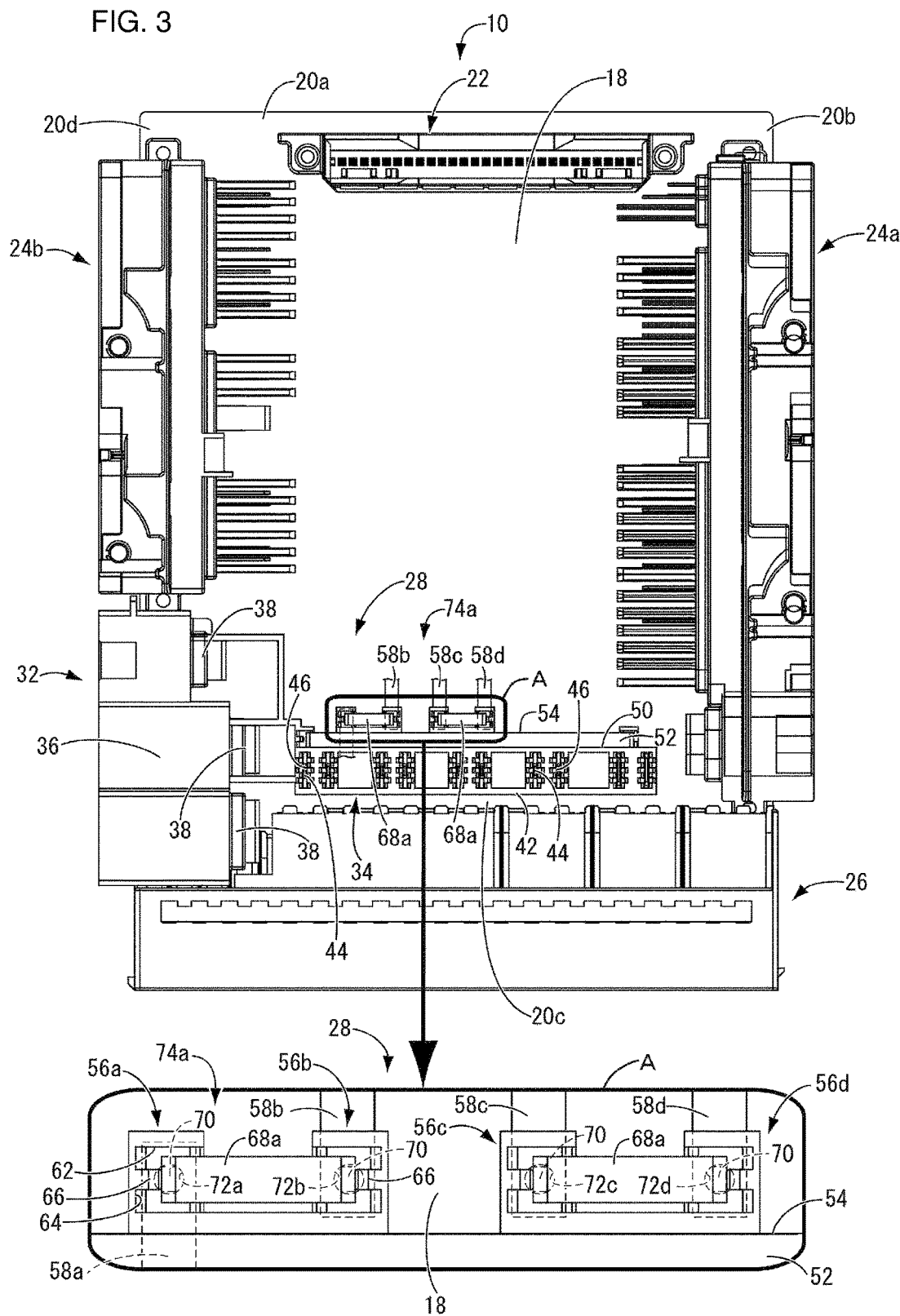
FIG. 3 is a plan view of the circuit structure using a printed-circuit board according to the present embodiment.

As shown in FIGS. 1 and 3, the circuit structure 10 includes a printed-circuit board 18, and various members disposed at the central portion and outer peripheral portions 20*a* to 20*d* of the printed-circuit board 18. More specifically, the printed-circuit board 18 has a rectangular plate shape, and various electric components such as relays (not shown) are mounted at the central portion of the printed-circuit board 18. At the outer peripheral portion 20*a* on one side of the printed-circuit board 18, an upwardly protruding external connection connector 22 having a longitudinal shape is disposed along the outer peripheral portion 20*a*. A lateral connection-type connector 24*a* is disposed at the outer peripheral portion 20*b* on one side orthogonal to the outer peripheral portion 20*a*, and a lateral connection-type connector 24*b* is disposed at the outer peripheral portion 20*d* that opposes the outer peripheral portion 20*b*. In addition, a fuse module 26 and a power supply connector module 28 are both provided at the outer peripheral portion 20*c* located opposite the external connection connector 22 in the printed-circuit board 18. Here, in the fuse module 26, a plurality of fuse mounting portions 30 to each of which a fuse 29 can be mounted are formed so as to be aligned in the longitudinal direction of the fuse module 26, and disposed along a lateral edge portion of the outer peripheral portion 20*c*, and the power supply connector module 28 is disposed along the outer peripheral portion 20*c* at a rearward position adjacent to the fuse module 26.

As shown in FIGS. 1 and 3, the power supply connector module 28 includes a power supply connector portion 32 and a pedestal portion 34. The power supply connector portion 32 includes three laterally open connector housings 36 having a substantially rectangular box shape and made of a synthetic resin, and bus bars 38 that are inserted into the respective connector housings 36. Each of the bus bars 38 is substantially L-shaped, and formed by a wide metal plate made of, for example, copper or a copper alloy that has been punched out through press working and bending it at a right angle. A soldering portion 40 that is soldered to the printed-circuit board 18 is provided at one end portion of each bus bar 38, and a tab terminal (not shown) that is housed inside the connector housing 36 is formed at the other end portion of the bus bar 38. Since the bus bar 38 is formed to be wide so as to have low resistance in this manner, it is possible to handle a large current for supplying power.

On the other hand, as shown in FIGS. 1 and 3, the pedestal portion 34 includes a pedestal 42 that is made of a synthetic resin and has a substantially rectangular block shape, and substrate terminals 44. More specifically, the substrate terminals 44 are inserted into terminal accommodating holes 46 that are provided in the pedestal 42 and open in a vertical direction extending from the upper surface to the bottom surface of the pedestal 42, and each of the substrate terminals 44 has the shape of a wide, substantially vertically oriented, rectangular plate formed by a metal plate that is made of, for example, copper or a copper alloy that has been punched out through press working. A soldering portion 48 that is soldered to the printed-circuit board 18 is provided at one end portion of each of the substrate terminals 44, and a substantially wide flat plate-shaped connection portion 49 that is connected to an opposing connector (not shown) is formed at the other end portion of the substrate terminal 44, so that the substrate terminal 44 can handle a large current as a power supply terminal. Then, the opposing connector (not shown) is attached to the power supply connector portion 32, and is thereby connected to print wiring (not shown) formed on the printed-circuit board 18 via the bus bar 38, so that power can be supplied via the print wiring to the substrate terminal 44 that is inserted through the pedestal portion 34.

Figure 4:
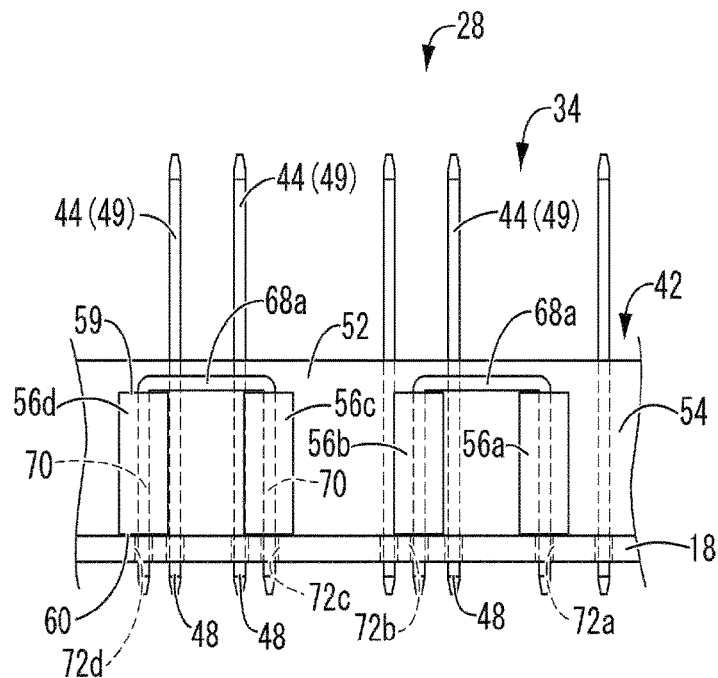
FIG. 4 is a rear view of FIG. 3, showing only a printed-circuit board and a pedestal-equipped power connector.

As shown in FIGS. 3 and 4, a bus bar support base attachment portion 52 protruding rearward (upward in FIG. 3) in a substantially horizontally oriented, rectangular cross-sectional shape in rear view is provided on a rear surface 50 of the pedestal portion 34. Then, on a rear surface 54 of the bus bar support base attachment portion 52, four bus bar support bases 56a to 56d are provided so as to be spaced apart from each other in the longitudinal direction (the lateral direction in FIG. 3) of the bus bar support base attachment portion 52 from the power supply connector portion 32 side. That is, the bus bar support bases 56a to 56d are formed integrally with the power supply connector module 28, which is an electric component mounted on the printed-circuit board 18. Accordingly, it is not necessary to separately provide the bus bar support bases 56a to 56d constituting the circuit components, and thus it is possible to save space and reduce the number of components. Moreover, as shown in FIG. 3, for example, circuit patterns 58a to 58d were already routed in the power supply connector module 28. Therefore, by using the circuit patterns 58a to 58d, through holes 72a to 72d, which will be described later, serving as connection points of the circuit patterns 58a to 58d can be easily disposed below the bus bar support bases 56a to 56d, so that it is possible to further save space. More specifically, each of the bus bar support bases 56a to 56d has the shape of a substantially rectangular pipe having a lead portion insertion hole 62 that is formed so as to extend from a substantial surface 59 of the bus bar support base attachment portion 52 to a bottom surface 60 and is open in a vertical direction (the vertical direction in FIG. 4). On an inner surface 64 of the lead portion insertion hole 62, a pair of connection bus bar-holding projections 66 and 66 having a substantially rectangular cross-sectional shape in plan view are provided to hold lead portions 70 of the connection bus bars 68a to 68d, which will be described later, by protruding in the extension direction (the lateral direction in FIG. 3) of the bus bar support base 56 (see the bus bar support base 56d in FIG. 5).

Then, as shown in FIGS. 3 and 4, by mounting one substantially gate-shaped connection bus bar 68a between the bus bar support bases 56a and 56b and between the bus bar support bases 56c and 56d, the pair of lead portions 70 and 70 provided at the opposite end portions of the connection bus bar 68a are inserted through the corresponding lead portion insertion holes 62. The connection bus bars 68a are formed, for example by cutting a rod-shaped metal wire material to a predetermined length, and then bending the opposite end portions at a right angle in one direction. Here, the tip portions of the lead portions 70 that are inserted through the lead portion insertion holes 62 are formed so as to protrude from the bottom surface side of the lead portion insertion holes 62. The protruding tip portions of the lead portions 70 are inserted through and soldered to the through holes 72a to 72d of the printed-circuit board 18, and thus, the lead portions 70 are electrically connected via a conductive path (not shown) exposed on the inner surfaces of the through holes 72a to 72d to the circuit patterns 58a to 58d through print wiring disposed on the printed-circuit board 18. Note that in the present embodiment, one circuit specification 74a is provided by the circuit pattern 58a being connected to the circuit pattern 58b and the circuit pattern 58c being connected to the circuit pattern 58d.

Figure 5:
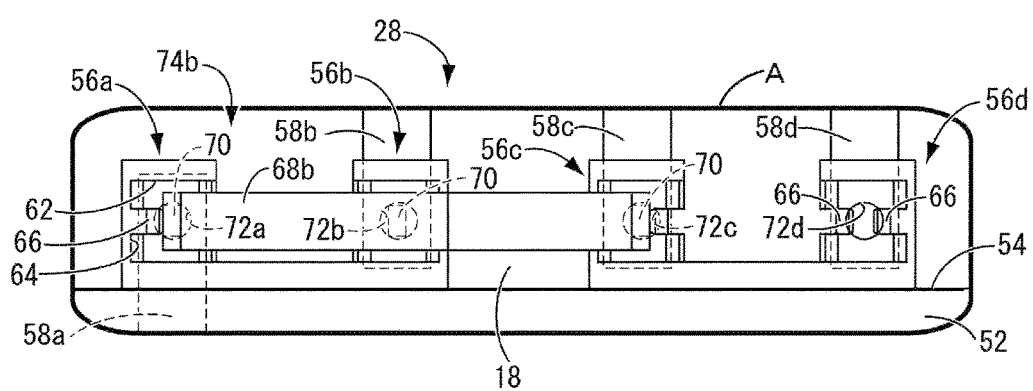
FIG. 5 is a plan view of the region A shown in FIG. 3, showing a state where another circuit specification is provided by another circuit pattern connection switching according to the present embodiment.

According to another mode of the present embodiment, as shown in FIG. 5, one substantially comb-shaped connection bus bar 68b may be mounted to the bus bar support bases 56a, 56b, and 56c, thereby inserting three lead portions 70 provided at the opposite end portions and the central portion of the connection bus bar 68b through the lead portion insertion holes 62. The connection bus bar 68b can be formed, for example, by press punching and bending a metal plate made of copper, a copper alloy, or the like. Here, the tip portions of the lead portions 70 inserted through the lead portion insertion holes 62 are formed so as to protrude from the bottom surface side of the lead portion insertion holes 62. The protruding tip portions of the lead portions 70 are inserted through and soldered to the through holes 72a to 72c of the printed-circuit board 18, and thereby, the lead portions 70 are electrically connected via a conductive path (not shown) exposed on the inner surfaces of the through holes 72a to 72c to the circuit patterns 58a to 58c through the print wiring disposed on the printed-circuit board 18. In this manner, in another mode of the present embodiment, a second circuit specification 74b is provided by the circuit patterns 58a to 58c being connected to each other.

Figure 6:
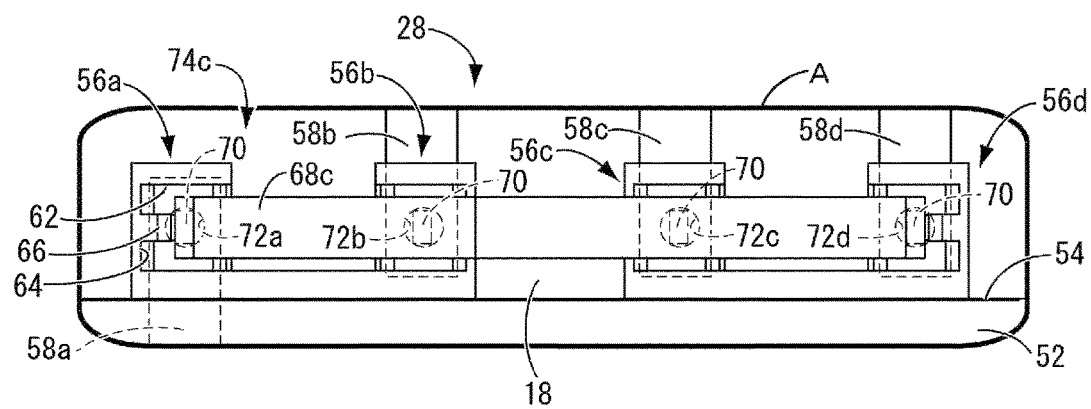
FIG. 6 is a plan view of the region A shown in FIG. 3, showing a state where yet another circuit specification is provided by yet another circuit pattern connection switching according to the present embodiment.

Alternatively, according to yet another mode of the present embodiment, as shown in FIG. 6, one substantially comb-shaped connection bus bar 68c may be mounted to the bus bar support bases 56a to 56d as a whole, thereby inserting four lead portions 70 provided at the opposite end portions and the central portion of the connection bus bar 68c through the lead portion insertion holes 62. The connection bus bar 68c can be formed, for example, by press punching and bending a metal plate made of copper, a copper alloy, or the like. Here, the tip portions of the lead portions 70 inserted through the lead portion insertion holes 62 are formed so as to protrude from the bottom surface side of the lead portion insertion holes 62. The protruding tip portions of the lead portions 70 are inserted through and soldered to the through holes 72a to 72d of the printed-circuit board 18, and thereby, the lead portions 70 are electrically connected via a conductive path (not shown) exposed on the inner surfaces of the through holes 72a to 72d to the circuit patterns 58a to 58d through the print wiring disposed on the printed-circuit board 18. In this manner, in yet another mode of the present embodiment, a third circuit specification 74c is provided by the circuit patterns 58a to 58d being connected to each other.

Figure 7:
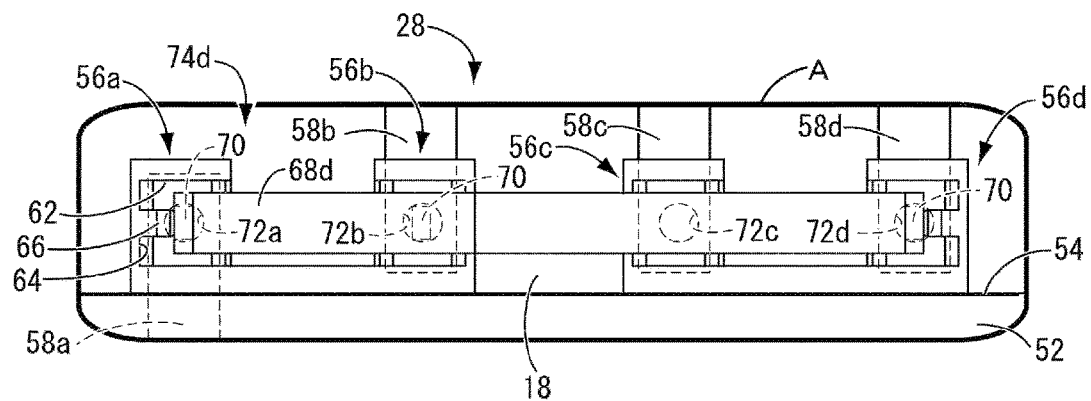
FIG. 7 is a plan view of the region A shown in FIG. 3, showing a state where still another circuit specification is provided by still another circuit pattern connection switching according to the present embodiment.
Figure 8:
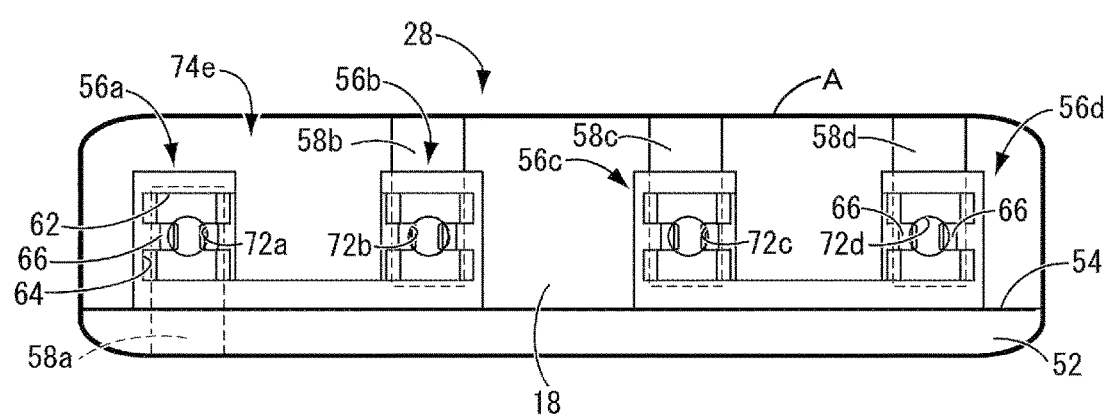
FIG. 8 is a plan view of the region A shown in FIG. 3, showing a state where a circuit specification is provided in which the circuit pattern connection switching according to the present embodiment is not performed.

As described thus far, in the present embodiment, the circuit patterns 58a to 58d are provided by the print wiring disposed on the printed-circuit board 18, and the connection bus bars 68a to 68d and the bus bar support bases 56a to 56d that constitute circuit switching components are placed on the printed-circuit board 18. Then, in a mode of the present embodiment shown in FIGS. 3 to 4, the circuit specification 74a is provided by the connection bus bar 68a selected from the connection bus bars 68a to 68d being mounted and held on the bus bar support bases 56a to 56d. In another mode of the present embodiment shown in FIG. 5, the circuit specification 74b is provided by the connection bus bar 68b being mounted and held on the bus bar support bases 56a to 56c. Furthermore, in yet another mode of the present embodiment shown in FIG. 6, the circuit specification 74c is provided by the connection bus bar 68c being mounted and held on the bus bar support bases 56a to 56d. Furthermore, as shown in FIG. 7, by using a connection bus bar 68d, which is obtained by reducing the number of lead portions 70 of the connection bus bar 68c shown in FIG. 6, it is possible to provide yet another circuit specification 74d. In addition, as shown in FIG. 8, it is also possible to provide a circuit specification 74e in which none of the connection bus bars 68a to 68d are mounted. In this manner, by changing the mounting mode (the selection of the type, the number, and the mounting position) of the connection bus bars 68a to 68d to the bus bar support bases 56a to 56d, many types of circuit specifications including the circuit specifications 74a to 74e can be provided in a simple and reliable manner.

Here, the lead portions 70 of the connection bus bars 68a to 68d constituting the circuit switching components are inserted through and soldered to the through holes 72a to 72d of the printed-circuit board 18 that constitute connection points disposed below the bus bar support bases 56a to 56d, and thereby, the lead portions 70 are electrically connected to the circuit patterns 58a to 58d via a conductive path (not shown) exposed on the inner surfaces of the through holes 72a to 72d. Accordingly, the through holes 72a to 72d are arranged so as to be spaced apart from each other in the extension direction (the lateral direction in FIG. 3) of the bus bar support base 56. The connection bus bars 68a to 68d are classified according to their length dimension (the maximum length dimension in the lateral direction in FIG. 3 and FIGS. 5 to 6) in the extension direction of the bus bar support bases 56a to 56d, the number of lead portions 70 electrically connected to the through holes 72a to 72d, and the protruding position of the lead portions 70.

Then, such a circuit structure 10, which uses the printed-circuit board 18 on which the external connection connector 22, the lateral connection-type connectors 24a and 24b, the fuse module 26, and the power supply connector module 28 are mounted to the outer peripheral portions 20a to 20d, and various electric components such as relays and connectors are mounted at the central portion, is housed between the upper case 14 and the lower case 16, and the upper case 14 and the lower case 16 are assembled to each other, thus completing an electrical junction box 12. In this state, the fuse module 26, the power supply connector module 28, and the lateral connection-type connectors 24a and 24b are disposed in an open state on lateral sides of the two cases 14 and 16, and the external connection connector 22 is inserted through a connector insertion hole 76 of the upper case 14 so as to protrude to the outside.

With the thus configured circuit structure 10 using the printed-circuit board 18, the through holes 72a to 72d serving as the connection points of the circuit patterns 58a to 58d are locally disposed below the bus bar support bases 56a to 56d constituting the circuit switching components, and thereby, many types of circuit specifications including the circuit specifications 74a to 74e can be provided in a simple and reliable manner by changing the mounting mode (the selection of the type, the number, and the mounting position) of the connection bus bars 68a to 68d to the bus bar support bases 56a to 56d. Moreover, the circuit specification can be easily identified because only the mounting mode of the connection bus bars 68a to 68d is changed. Accordingly, it is possible to efficiently perform verification work and reduce verification errors.

Since the length of the connection bus bars 68a to 68d constituting the circuit switching component can be minimized, it is possible to reduce the material costs and the like. Also, the through holes 72a to 72d serving as the connection points are arranged so as to be spaced apart from each other in the extension direction of the bus bar support bases 56a to 56d, so that it is possible to advantageously solve the problem of interference between the connection bus bars 68a to 68d and other members. In addition, since the connection bus bars 68a to 68d are mounted and held on the bus bar support bases 56a to 56d, it is possible to advantageously ensure connection stability between the circuit patterns 58a to 58d.

Although an embodiment of the present invention has been described above in detail, the invention is not intended to be limited by the specific description thereof. For example, the present embodiment has been described taking a case where four circuit patterns 58a to 58d are used as an example. However, the number of the circuit patterns 58 may be any number of two or more. As the connection bus bar 68, it is possible to use any connection bus bar that can be mounted and held on the bus bar support base 56 and whose lead portion 70 can be inserted into two or more through holes 72 serving as connection points. In addition, although the bus bar support base 56 is provided integrally with the power supply connector module 28 in the present embodiment, it may be formed as a separate member.

What is claimed is:

1. A circuit structure comprising:
   a printed-circuit board on which a plurality of circuit patterns are provided; and
   a circuit switching component placed on the printed-circuit board, wherein
   the circuit switching component includes a plurality of types of connection bus bars, and a bus bar support base on which any connection bus bar selected from the plurality of types of connection bus bars can be mounted and held,
   respective connection points of the plurality of circuit patterns are disposed below the bus bar support base and arranged so as to be spaced apart from each other in an extension direction of the bus bar support base,
   the plurality of types of connection bus bars are different from each other and are configured to engage different connection points of the plurality of circuit patterns so as to be electrically connected to the connection points, and wherein mounting any one of the plurality of connection bus bars to corresponding connection points of the plurality of circuit patterns provides a corresponding one of a
   a plurality of types of circuit specifications.

2. The circuit structure according to claim 1, wherein the plurality of circuit patterns include three or more circuit patterns, the connection points of the circuit patterns are provided below the bus bar support base, and three or more lead portion insertion holes are formed so as to extend through the bus bar support base at positions corresponding to the connection points of the three or more circuit patterns.

3. The circuit structure according to claim 1, wherein the bus bar support base is formed integrally with an electric component mounted on the printed-circuit board.

4. The circuit structure according to claim 3, wherein the electric component is a power supply connector module.

5. The circuit structure according to claim 2, wherein the bus bar support base is formed integrally with an electric component mounted on the printed-circuit board.

* * * * *